(12) United States Patent
Oshiba et al.

(10) Patent No.: US 6,246,709 B1
(45) Date of Patent: Jun. 12, 2001

(54) INTEGRATED OPTICAL ELEMENT AND METHOD FOR MANUFACTURING AN INTEGRATED OPTICAL ELEMENT

(75) Inventors: Saeko Oshiba; Koji Nakamura; Hideaki Horikawa, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/087,907

(22) Filed: Jun. 1, 1998

(51) Int. Cl.⁷ ....................................... H01S 5/00

(52) U.S. Cl. ............................... 372/50; 372/46

(58) Field of Search ................... 372/50, 46, 45

(56) References Cited

U.S. PATENT DOCUMENTS 4,689,797 * 8/1987 Olshansky .............................. 372/45
4,802,187 * 1/1989 Bouley et al. .......................... 372/96

FOREIGN PATENT DOCUMENTS 3-240006 * 10/1991 (JP) .
7-244303 * 9/1995 (JP) .

OTHER PUBLICATIONS

Koji Nakamura et al. "Buried Heterostructure DFB Laser Integrated with Ridge Waveguide Electroabsorption Modulator With Over 20 GHz Bandwidth": European Conference on Optical Communications 97, Sep. 22–25, 1997, Conference Publication No. 448, IEE, pp. 175–178.
Isamu Kotaka et al. "High Speed (20Gbit/s) a Low Drive Voltage (2Vp–p) Strained InGaAsP MQW Modulator/DFB Laser Light Source": vol. J77–C–I No. 5, pp. 268–275, May 1994. in *Electronic Communication Society Monogram Collection*.

* cited by examiner

*Primary Examiner*—Teresa M. Arroyo
*Assistant Examiner*—Q. P. Leung
(74) *Attorney, Agent, or Firm*—Jones Volentine, L.L.C.

(57) ABSTRACT

In a modulator integrated laser 100, a wave guide channel 200a in a modulator area 200 having a core constituted of an absorption layer 204 and a wave guide channel 250a at a laser area 250 having a core constituted of an active layer 254 are optically connected with each other by a wave guide channel 150a having a core constituted of a light wave guide layer 204b. The width of the light wave guide layer 204b increases in a continuous manner as the distance from the modulator area 200 increases and the width also increases in a continuous manner as the distance from the laser area 250 increases, with the width achieving its maximum in the vicinity of the middle area between the modulator area 200 and the laser area 250.

17 Claims, 11 Drawing Sheets

INTEGRATED OPTICAL ELEMENT AND METHOD FOR MANUFACTURING AN INTEGRATED OPTICAL ELEMENT

BACKGROUND OF THE INVENTION

The present invention relates to an integrated optical element and a method for manufacturing an integrated optical element.

An integrated optical element is, for instance, achieved by forming a plurality of functional areas where specific types of processing are implemented on a guided wave light so that the wave guide channels at the individual functional areas are connected to each other on, for instance, a substrate. Integrated optical elements formed in this manner in the conventional art include the light modulator integrated laser disclosed in an article entitled "High-Speed(20 Gbit/s), Low-Drive-Voltage (2Vp-p)Strained-InGaAsP MQW Modulator/DFB Laser Light Source" in the Electronic Communication Society Monogram Collection C-1 Vol. J77-C-1 No. 5 pp. 268–275, May, 1994. In this light modulator integrated laser, a DFB laser (distributed feedback laser) area and a modulator area are formed as functional areas.

In a light modulator integrated laser in the conventional art, the wave guide channel in the laser area is formed to achieve an embedded wave guide channel structure so that a low threshold value, single mode oscillator and a higher output are achieved through sufficient light trapping. In addition, the wave guide channel in the modulator area in the light modulator integrated laser in the prior art is formed to achieve a so-called high mesa structure in order to realize high speed modulation through a lowered element capacity.

It is to be noted that a wave guide channel in a semiconductor optical element normally adopts a laminated structure which is achieved by sequentially laminating a first clad layer, a light wave guide layer which is to constitute the active core and a second clad layer on a substrate in order to achieve light trapping in the longitudinal direction. Moreover, in the wave guide channel of the semiconductor optical element, a mesa structure is formed from several layers at the side where the second clad layer is formed in this laminated structure, under normal circumstances. The mesa structure in this context refers to a structure in which a cross section perpendicular to the direction in which the guided wave light is transmitted forms a mesa (trapezoidal shape), which may be formed through, for instance; etching, selective growth or the like.

The high mesa structure, which is adopted in the modulator area of a light modulator integrated laser in the prior art refers to a structure in which the light wave guide layer is included in the mesa structure. A structure in which the light wave guide layer is not included in the mesa structure, in contrast, is referred to as a low mesa structure.

In order to manufacture the light modulator integrated laser in the conventional art disclosed in the publication above, first, a multiple quantum well (MQW) layer that is to constitute a light wave guide layer is grown on a substrate on which the first clad layer has been formed, in a portion that is to constitute the modulator area, the portion that is to constitute the laser area and the area that is to constitute a separation area which is located between the two areas mentioned earlier.

Next, etching is performed down to the first clad layer on the portion that is to constitute the layer area while leaving the multiple quantum well layer over a width of approximately 1.5 micrometers and etching is performed down to the first clad layer on the portion that is to constitute the modulator area and the portion that is to constitute the separation area while leaving the multiple quantum well layer over a width of approximately 30 micrometers. Then, in order to achieve lateral light trapping in the multiple quantum well layer, both sides of the remaining multiple quantum well layer are filled with InP, forming p-n junctions. In addition, in order to achieve longitudinal light trapping, a laminated structure is formed by regrowing a clad layer constituted of p-InP and a contact layer, thereby forming an embedded type wave guide channel in the laser area.

Then, etching is performed on the portion that is to constitute the modulator area and the portion that is to constitute the separation area down to the first clad layer while leaving them unetched over widths of approximately 2.5–3 micrometers (<approximately 30 micrometers) and on the laser area down to the first clad layer by leaving it unetched over a width of approximately 220 micrometers (>1.5 micrometers). Through this etching, a wave guide channel having a high mesa structure is formed in the modulator area.

In the light modulator integrated laser in the conventional art which is manufactured as described above, a laser area having a core over a width of approximately 1.5 micrometers and a modulator area having a core over a width of approximately 2.5–3 micrometers are formed with a separation area having a core over a width of approximately 2.5–3 micrometers formed there between.

FIG. 11 presents a graph of the results of calculation of the relationship between the quantity of misalignment x between the cores and the coupling efficiency y of the guided wave light achieved when two wave guide channels are connected. The calculation is performed on the assumption that the two wave guide channels have cores over the same width W. It is learned from FIG. 11 that the coupling efficiency decreases as the width of the cores becomes smaller.

This means that the coupling efficiency tends to become reduced greatly and the alignment of the wave guide channels is extremely difficult in a structure in which wave guide channels having cores over a small width are connected with each other as in the light modulator integrated laser in the prior art. FIG. 11 indicates that on the scale of the light modulator integrated laser in the prior art, the coupling efficiency y becomes reduced down to approximately 0.5–0.6 even with the misalignment quantity x at approximately 1 micrometers.

In other words, since the coupling loss greatly increases if the alignment of the wave guide channels becomes even slightly offset in an integrated optical element in the conventional art, it is necessary that high precision in etching mask alignment be achieved during the manufacturing process. In addition, when an integrated element in the conventional art is miniaturized, it may result in a poor production yield of the element.

SUMMARY OF THE INVENTION

An object of the present invention, which is completed by addressing the problems of integrated optical elements in the prior art discussed above, is to provide a new and improved integrated optical element that allows for a less rigorous precision in the alignment of the wave guide channels during the manufacturing process to achieve an improvement in yield. Another object of the present invention is to provide a new and improved method for manufacturing an integrated optical element, which achieves an improvement in manufacturing efficiency through improvement in product yield.

In order to achieve the objects described above, an integrated optical element in a first aspect of the present invention (1) comprises (a) a first functional area having a first wave guide channel to implement a first type of optical processing in the first wave guide channel, (b) a second functional area having a second wave guide channel to implement a second type of optical processing in a second wave guide channel and (c) a third wave guide channel having a boundary area with a core over a larger width than the core at the rear end portion of the second wave guide channel and the width of the core at the rear end portion of the first wave guide channel and optically connects the rear end portion of the first wave guide channel and the rear end portion of the second wave guide channel wherein the width of the core of the third wave guide channel increases as it approaches the boundary area.

In addition, in order to achieve the objects described above, a method for manufacturing an integrated optical element in a second aspect of the present invention, through which an integrated optical element having a first functional area provided with a first wave guide channel in which a first mesa structure is achieved and a second functional area provided with a second wave guide channel in which a second mesa structure is achieved is formed, comprises (a) a step in which the mesa structure of the first wave guide channel is formed so that the width at the boundary area of the first functional area and the second functional area increases in a continuous manner from the first functional area side toward the second functional area and (b) a step in which the mesa structure in the second wave guide channel is formed so that the width at the boundary area of the first functional area and the second functional area increases in a continuous manner from the second functional area side toward the first functional area.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the Drawings:

Namely, FIG. 2 illustrates a manufacturing step for manufacturing the modulator integrated laser shown in FIG. 1, with FIG. 2(a) and FIG. 2(b) illustrating the schematic structure of the modulator integrated laser in FIG. 1 during this process, viewed from different directions;

FIG. 3 illustrates a manufacturing step for manufacturing the modulator integrated laser shown in FIG. 1, which follows the manufacturing step illustrated in FIG. 2 with FIG. 3(a) and FIG. 3(b) illustrating the schematic structure of the modulator integrated laser in FIG. 1 during this process, viewed from different directions;

FIG. 4 illustrates a manufacturing step for manufacturing the modulator integrated laser shown in FIG. 1, which follows the manufacturing step illustrated in FIG. 3, with FIG. 4(a) and FIG. 4(b) illustrating the schematic structure of the modulator integrated laser in FIG. 1 during this process, viewed from different directions;

FIG. 5 illustrates a manufacturing step for manufacturing the modulator integrated laser shown in FIG. 1, which follows the manufacturing step illustrated in FIG. 4, with FIG. 5(a) and FIG. 5(b) illustrating the schematic structure of the modulator integrated laser in FIG. 1 during this process, viewed from different directions;

FIG. 6 illustrates a manufacturing step for manufacturing the modulator integrated laser shown in FIG. 1, which follows the manufacturing step illustrated in FIG. 5, with FIG. 6(a) and FIG. 6(b) illustrating the schematic structure of the modulator integrated laser in FIG. 1 during this process, viewed from different directions;

FIG. 7 illustrates a manufacturing step for manufacturing the modulator integrated laser shown in FIG. 1, which follows the manufacturing step illustrated in FIG. 6, with FIG. 7(a) and FIG. 7(b) illustrating the schematic structure of the modulator integrated laser in FIG. 1 during this process, viewed from different directions;

FIG. 8 illustrates a manufacturing step for manufacturing the modulator integrated laser shown in FIG. 1, which follows the manufacturing step illustrated in FIG. 7, with FIG. 8(a) and FIG. 8(b) illustrating the schematic structure of the modulator integrated laser in FIG. 1 during this process, viewed from different directions;

FIG. 9 illustrates a manufacturing step for manufacturing the modulator integrated laser shown in FIG. 1, which follows the manufacturing step illustrated in FIG. 8, with FIG. 9(a) and FIG. 9(b) illustrating the schematic structure of the modulator integrated laser in FIG. 1 during this process, viewed from different directions;

FIG. 10 illustrates a manufacturing step for manufacturing the modulator integrated laser shown in FIG. 1, which follows the manufacturing step illustrated in FIG. 9, with FIG. 10(a) and FIG. 10(b) illustrating the schematic structure of the modulator integrated laser in FIG. 1 during this process, viewed from different directions.

DETAILED DESCRIPTION OF THE PREFERRED EMBODIMENT

The following is a detailed explanation of the preferred embodiment of the present invention, i.e., a modulator integrated laser 100, in reference to the attached drawings. It is to be noted that the same reference numbers are assigned to components having identical functions and structures in the following explanation and attached drawings and repeated explanation of them is omitted.

The structure of a modulator integrated laser 100 in an embodiment is explained with a main focus on the method for its manufacture, in reference to FIGS. 1(a)–10(b).

Figure 1A:
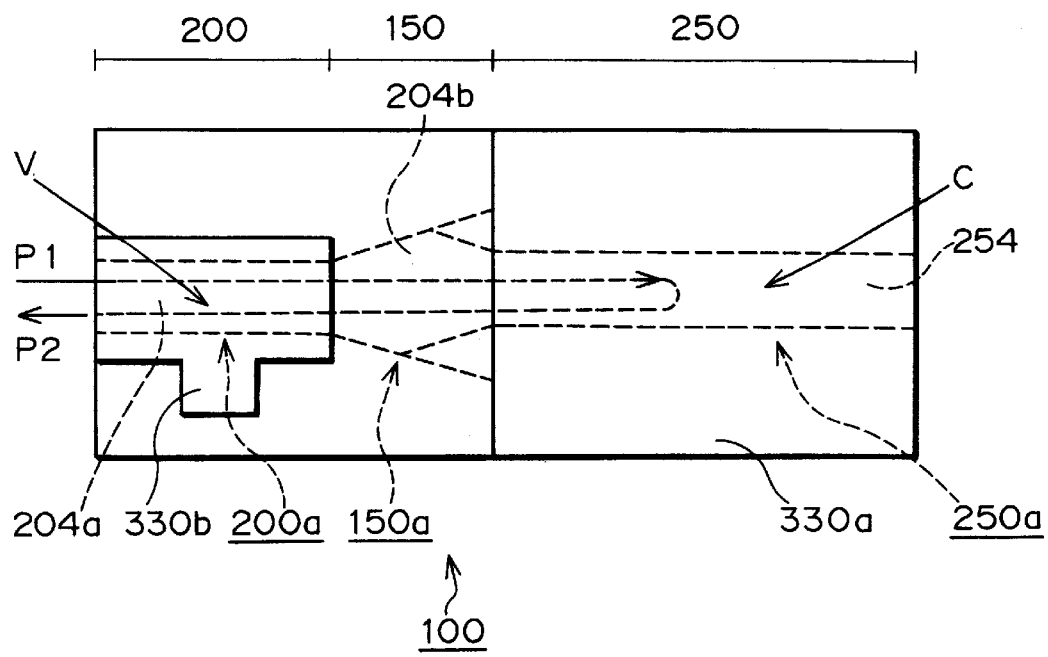
FIG. 1 illustrates a schematic structure of a modulator integrated laser adopting the present invention, with FIG. 1(a) and FIG. 1(b) illustrating the schematic structure of the modulator integrated laser adopting the present invention viewed from different directions.
Figure 1B:
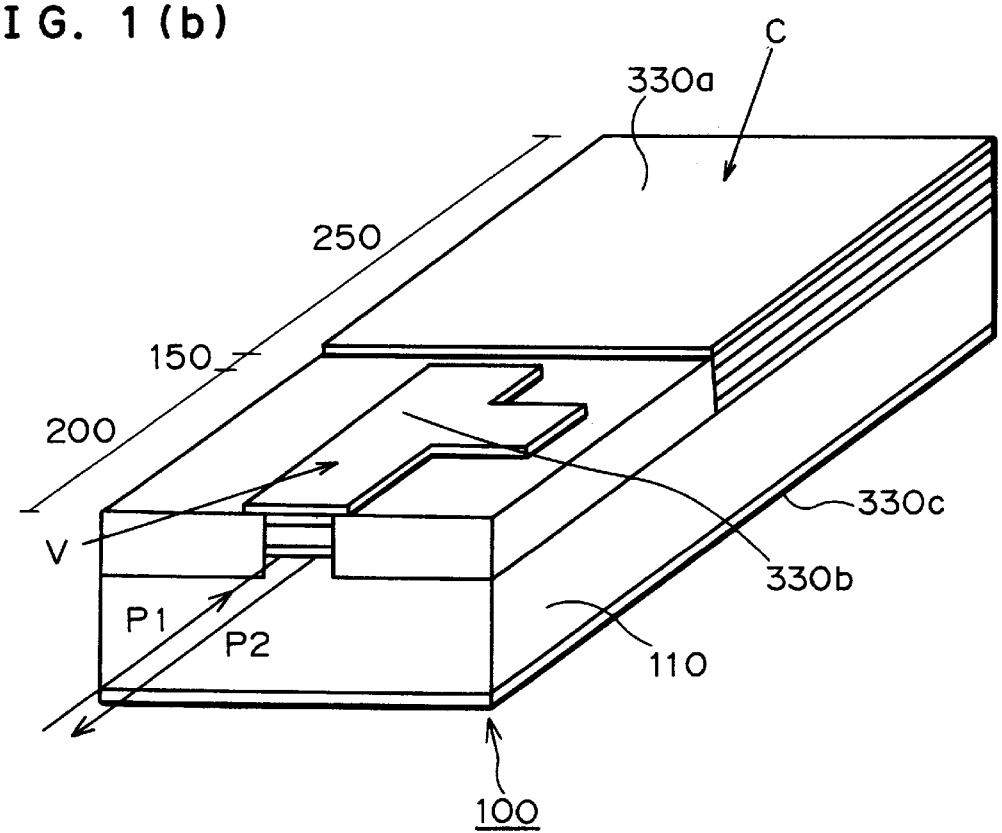

As shown in FIG. 1(b), the modulator integrated laser 100 in this embodiment is an integrated optical element which is constituted on an n-InP substrate 110 by forming a modulator area 200 and a laser area 250 across a separation area 150.

As illustrated in FIG. 1(a), the laser area 250 formed at the modulator integrated laser 100 is provided with an embedded type wave guide channel 250(a) and functions as a DFB laser. In addition, the modulator area 200 is provided with a wave guide channel 200(a) having a high mesa structure and functions as an absorption type modulator. Furthermore, the separation area 150 in this embodiment is provided with a wave guide channel 150(a) whose width increases at the center and functions as a link portion of the modulator area 200 and the laser area 250.

Figure 2A:
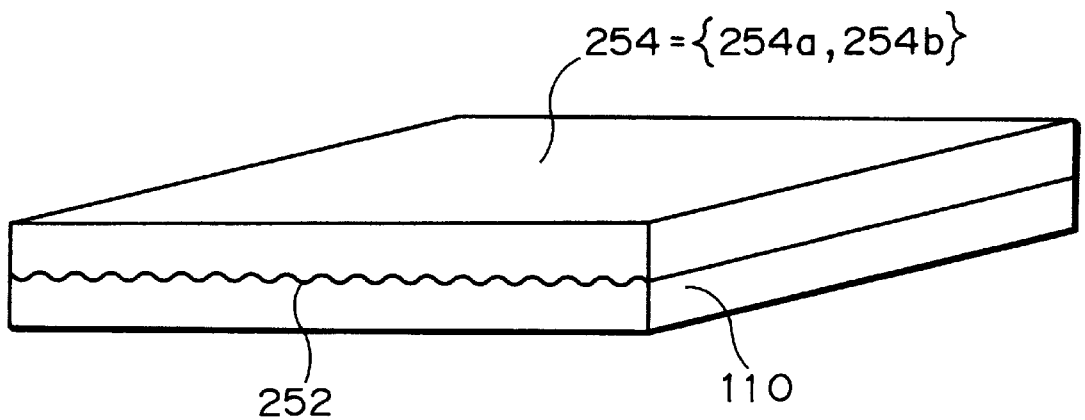
FIGS. 2–10 schematically illustrate the structure of the modulator integrated laser in FIG. 1 in correspondence to the individual steps in the manufacturing sequence.
Figure 2B:
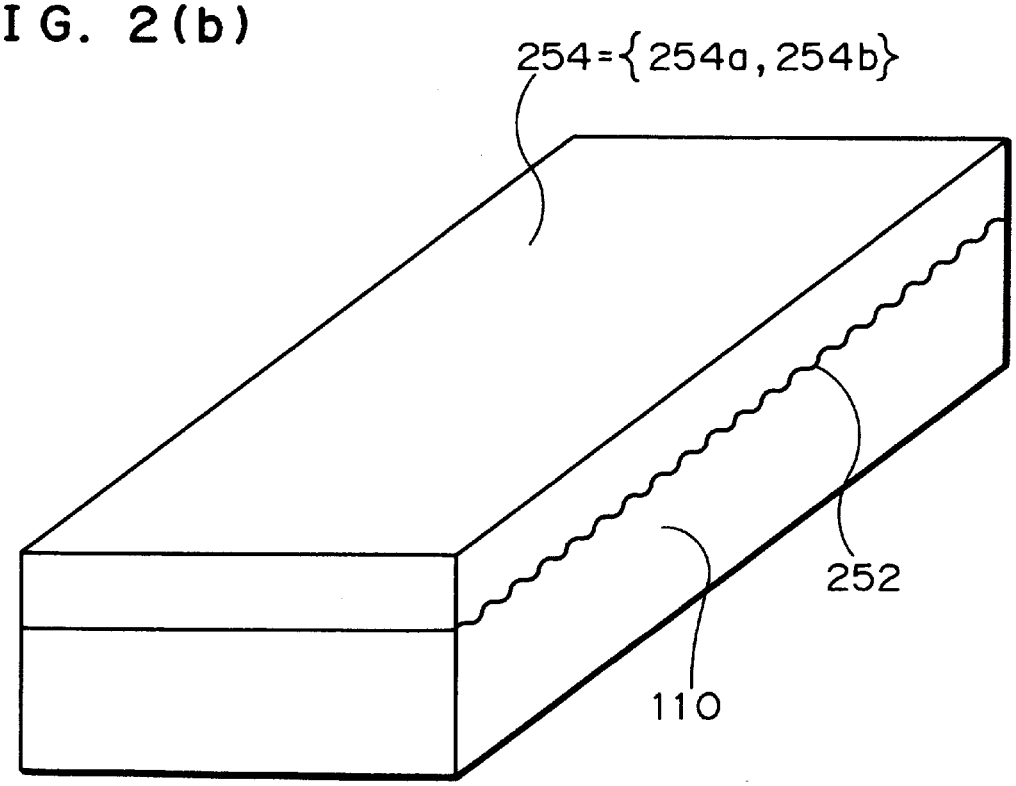

Now, the method for manufacturing this modulator integrated laser 100 is explained. First, as illustrated in FIGS. 2(a) and 2(b), grating (lattice) 252 which has selectivity for light of a specific wavelength is formed through, for instance, an interference exposure method, on the substrate 110, which functions as a clad layer as well as a substrate. Next, an active layer 254 is caused to grow epitaxially by employing an organo-metallic vapor phase epitaxy method (MOVPE) method, for instance.

The active layer 254 in the modulator integrated laser 100 is an undoped 5-layer multiple quantum well layer which is formed by alternately growing an InGaAsP barrier layer 254a and an InGaAs well layer 254b. This active layer 254 constitutes the core of the wave guide channel 250a (see FIG. 1(a)) in the laser area 250.

Figure 3A:
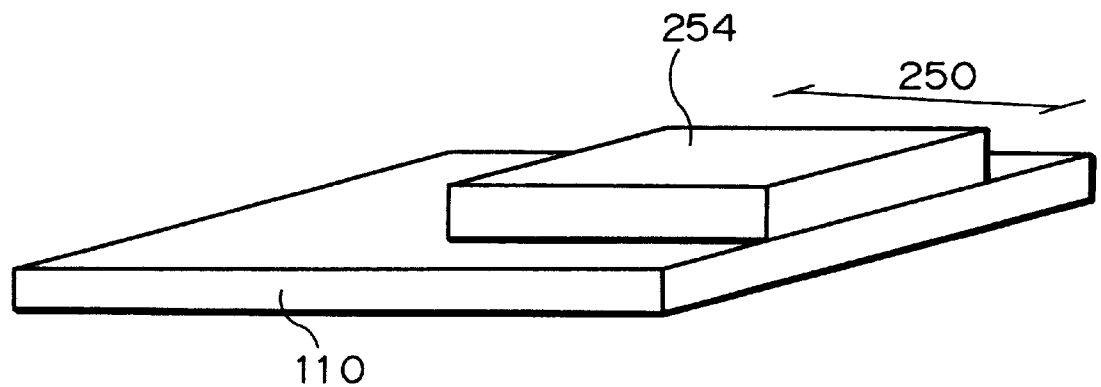
Figure 3B:
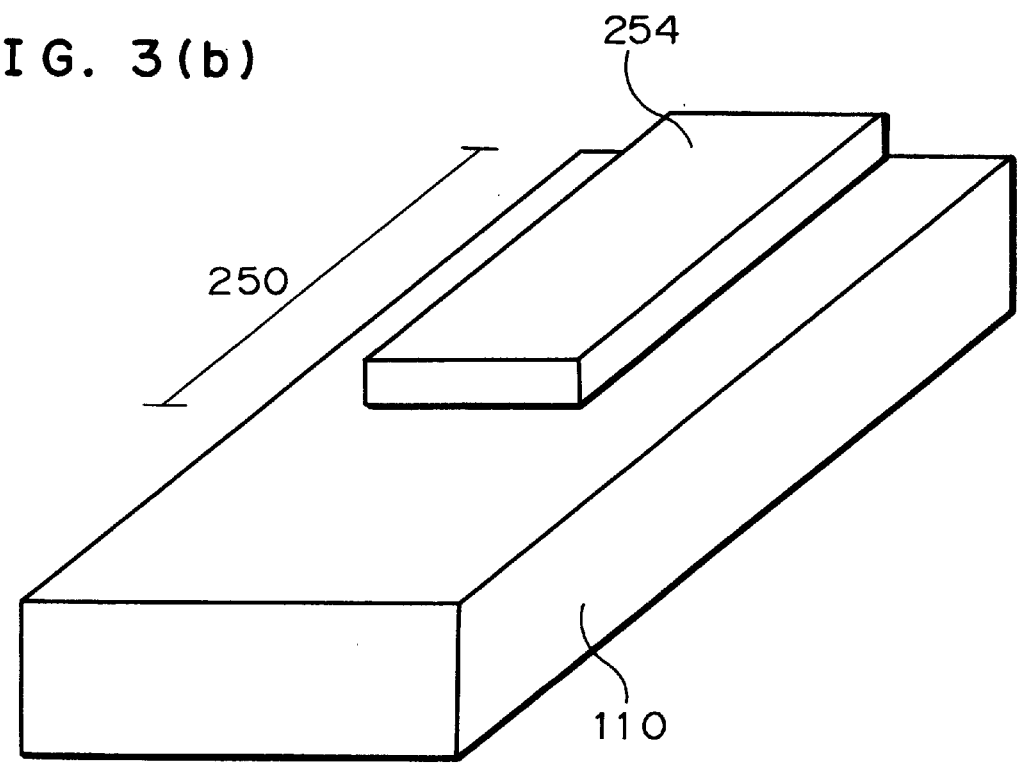
Figure 4A:
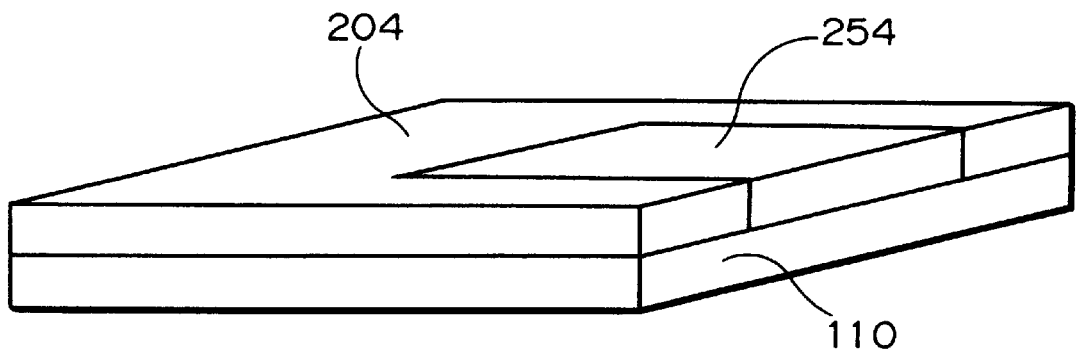
Figure 4B:
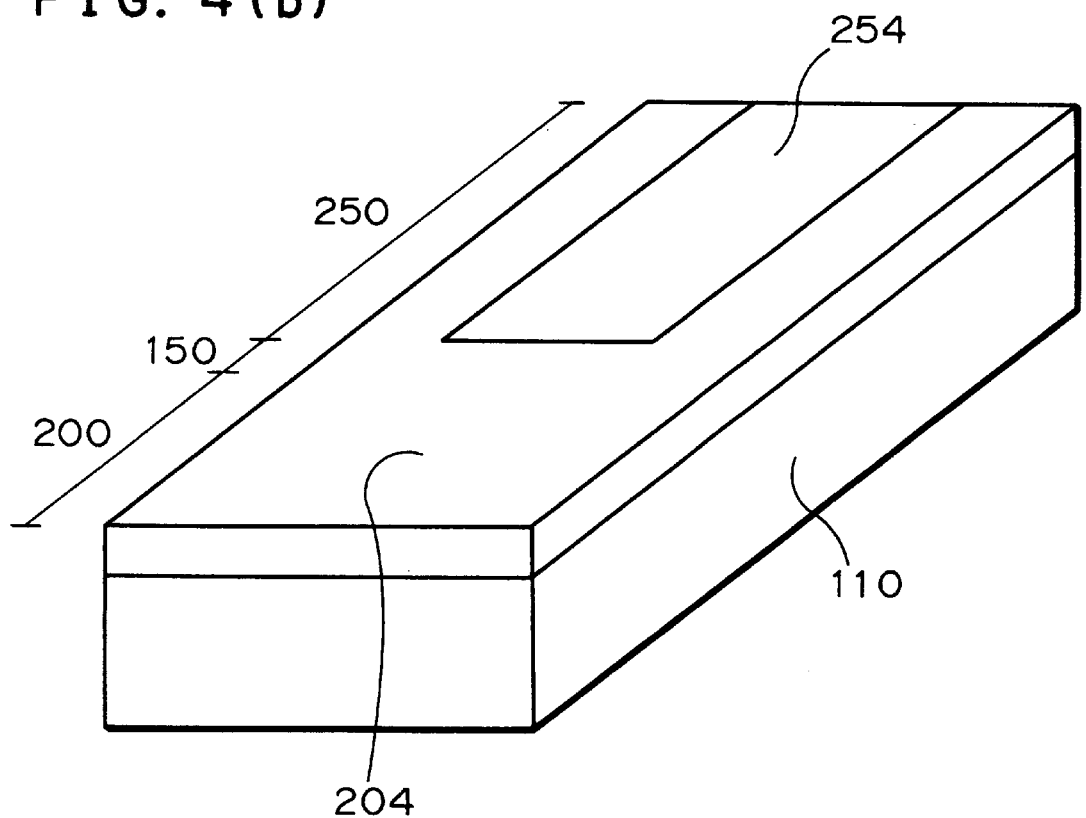

Next, as shown in FIGS. 3(a) and 3(b), the active layer 254 is removed from the substrate 110 through etching with only the active layer 254 corresponding to the laser area 250 left unetched in the form of an island. Then, as illustrated in FIGS. 4(a) and 4(b), a multiple quantum well layer 204 is selectively grown around the active layer 254 left intact in the form of an island on the substrate 110.

The multiple quantum well layer 204 in the modulator integrated laser 100, is an undoped 5-layer quantum well layer which is formed by alternately growing an InGaAsP barrier layer 204a and an InGaAs well layer 204b. As illustrated in FIG. 1(a), in the modulator integrated laser 100 in the embodiment, this multiple quantum well layer 204 constitutes the core of the wave guide channel 200a in the modulator area 200 and the wave guide channel 150a at the separation area 150 (see FIG. 1(a)).

Figure 5A:
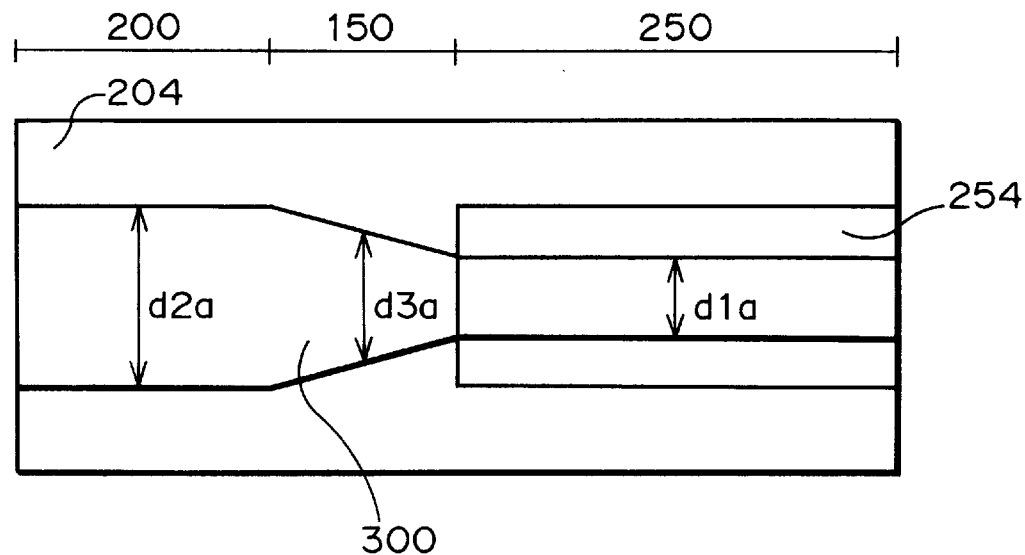
Figure 5B:
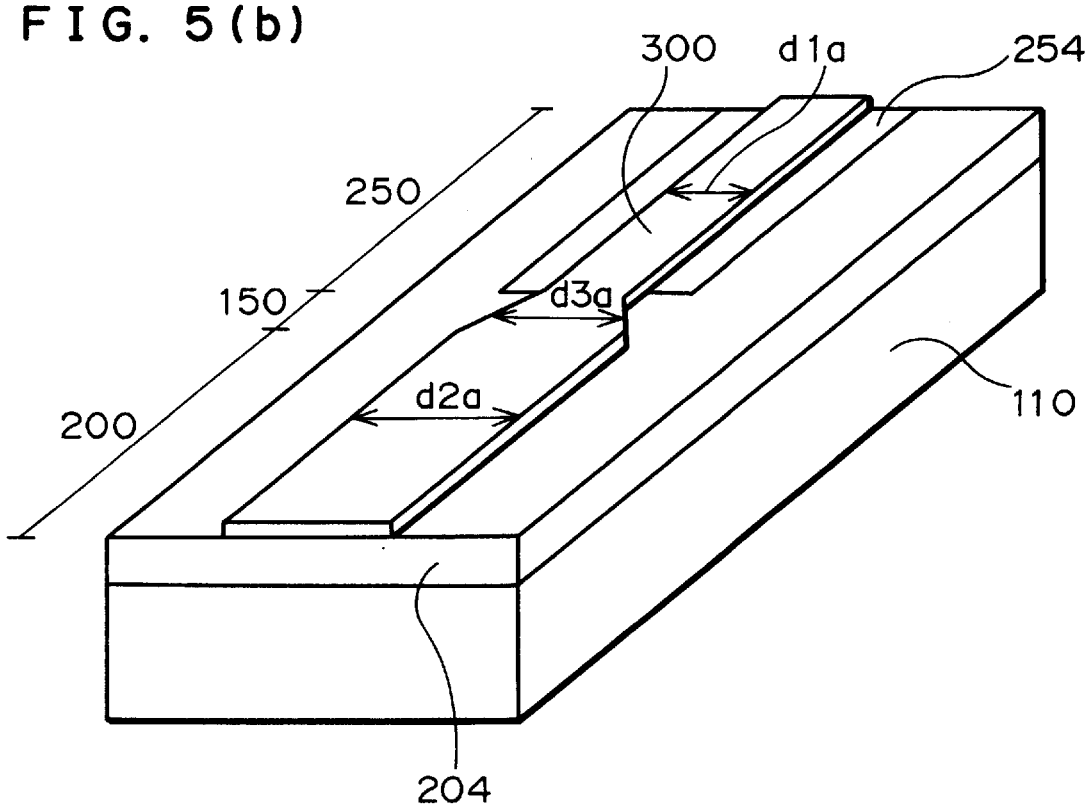

Next, as illustrated in FIGS. 5(a) and 5(b), a first etching mask 300 of this embodiment is formed through normal photolithography on the multiple quantum well layer 204 and the active layer 254 which have been epitaxially grown on the substrate 110.

This first etching mask 300 is formed to have a width d1a of approximately 1.5–2 micrometers in the laser area 250. It is also formed to have a width d2a of approximately 20–30 micrometers in the modulator area 200, and furthermore, the first etching mask 300 is formed in a tapered shape in the separation area 150 in this embodiment with its width d3a increasing in a continuous manner from d1a to d2a starting in the laser area 250 toward the modulator area 200.

Figure 6A:
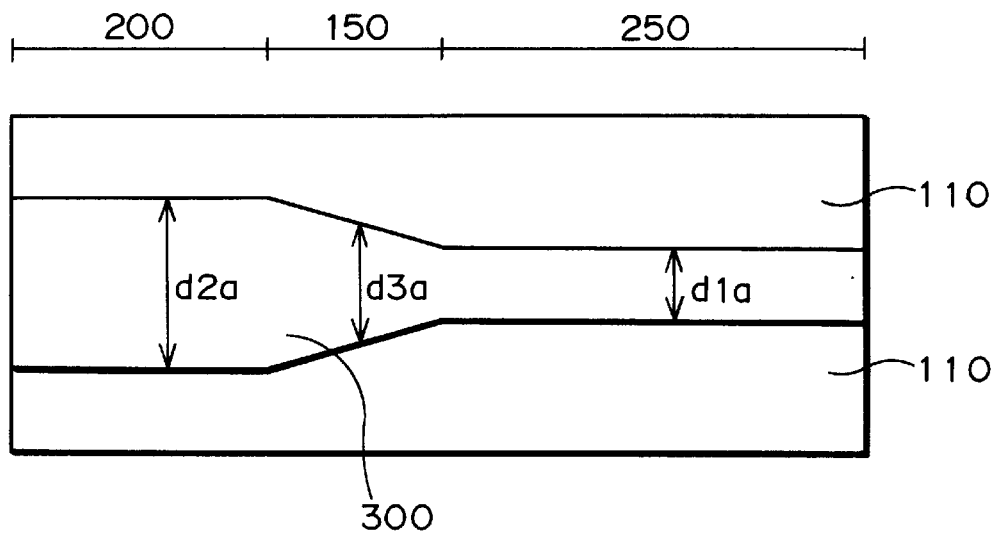
Figure 6B:
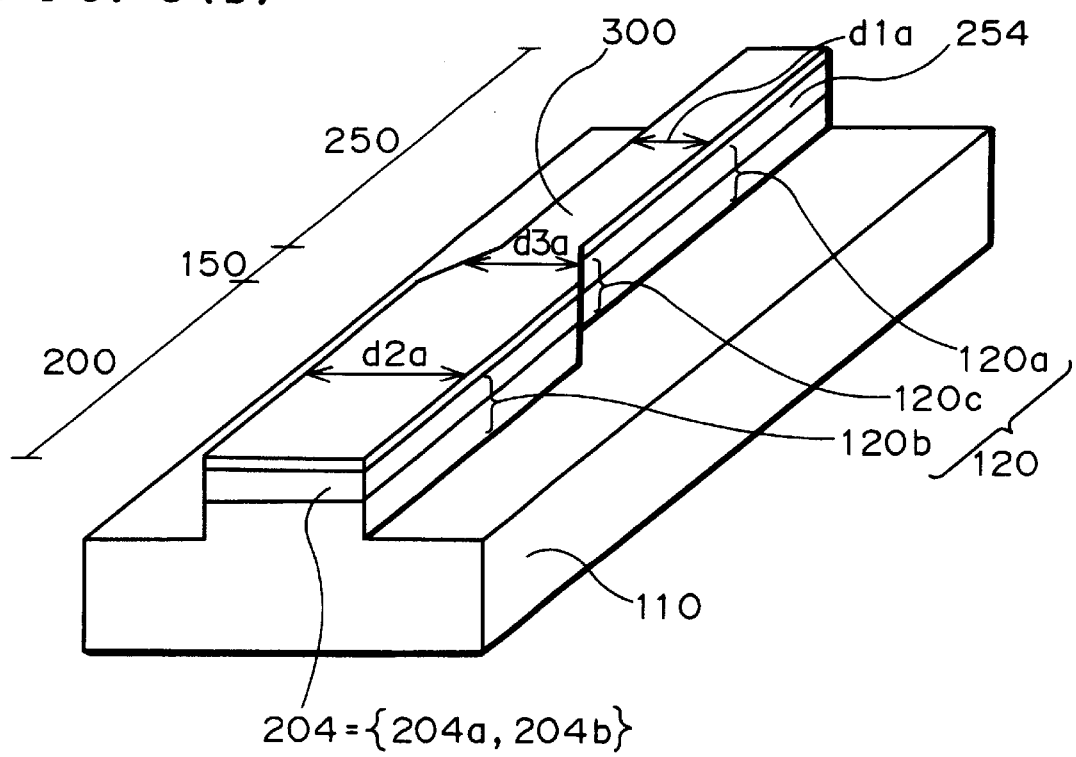

Then, as illustrated in FIGS. 6(a) and 6(b), the portions of the multiple quantum well layer 204 and the active layer 254 that are not covered by the first etching mask 300 are etched down to the substrate 110. Through this etching, a mesa structure 120a having a width of d1a is constituted of the upper portion of the substrate 110 and the active layer 254 in the laser area 250.

In addition, a mesa structure 120(b) having a width of d2a is constituted of the upper portion of the substrate 110 and the multiple quantum well layer 204 in the modulator area 200. Furthermore, in the separation area 150, a mesa structure 120c whose width d3a changes in a continuous manner is constituted of the upper portion of the substrate 110 and the multiple quantum well layer 204. It is to be noted that, in order to clearly state their respective functions in the modulator integrated laser 100, the multiple quantum well layer 204 in the modulator area 200 will be referred to as an absorption layer 204a and the multiple quantum well layer 204 at the separation area 150 will be referred to as a light wave guide layer 204b in the following explanation and in reference to the attached drawings.

Figure 7A:
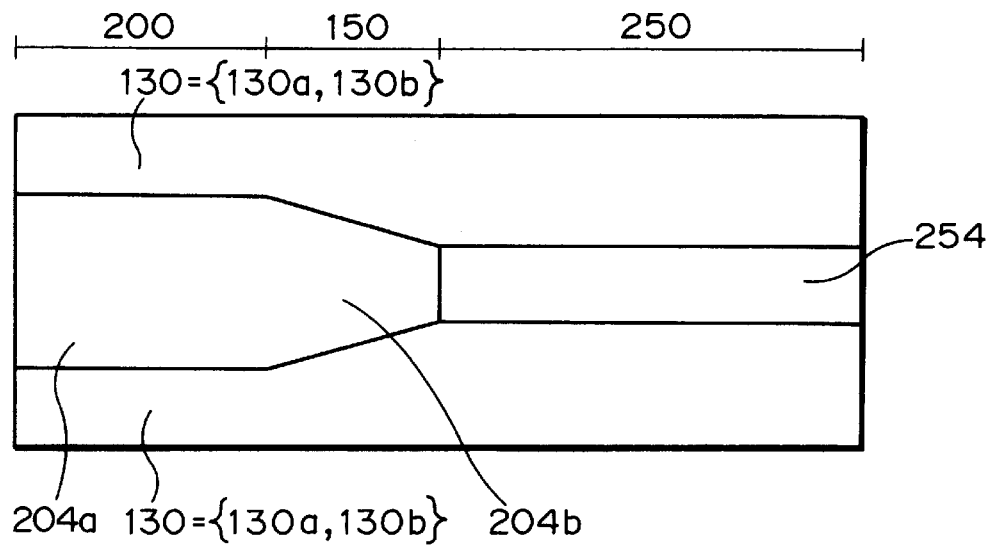
Figure 7B:
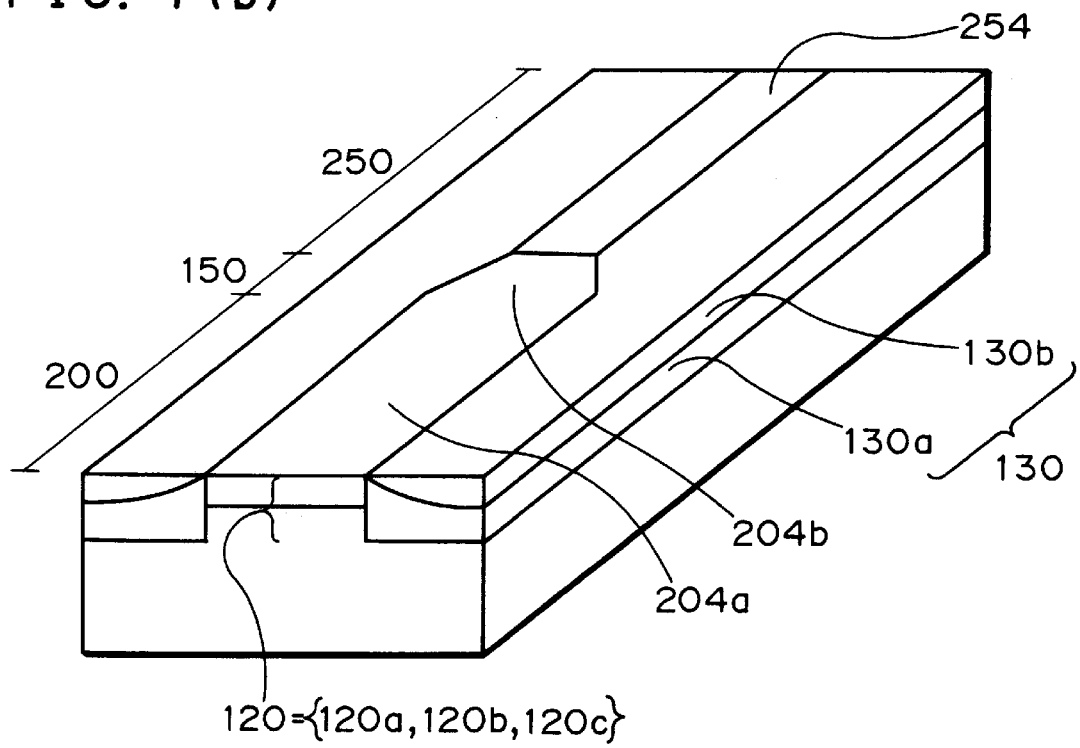

Next, as illustrated in FIGS. 7(a) and 7(b), the two sides of each of the mesa structure 120 (the mesa structure 120a, the mesa structure 120b and the mesa structure 120c) are sequentially filled with p-InP130a and n-InP130b to form an embedded layer 130 at both sides of the mesa structure 120. After the embedded layer 130 is formed, the first etching mask 300 (see FIGS. 6(a) and 6(b)) is removed.

Figure 8A:
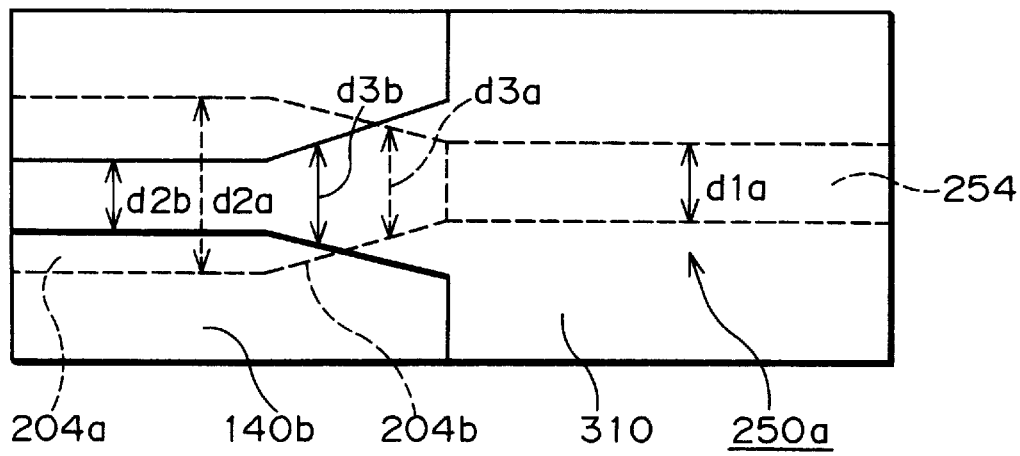
Figure 8B:
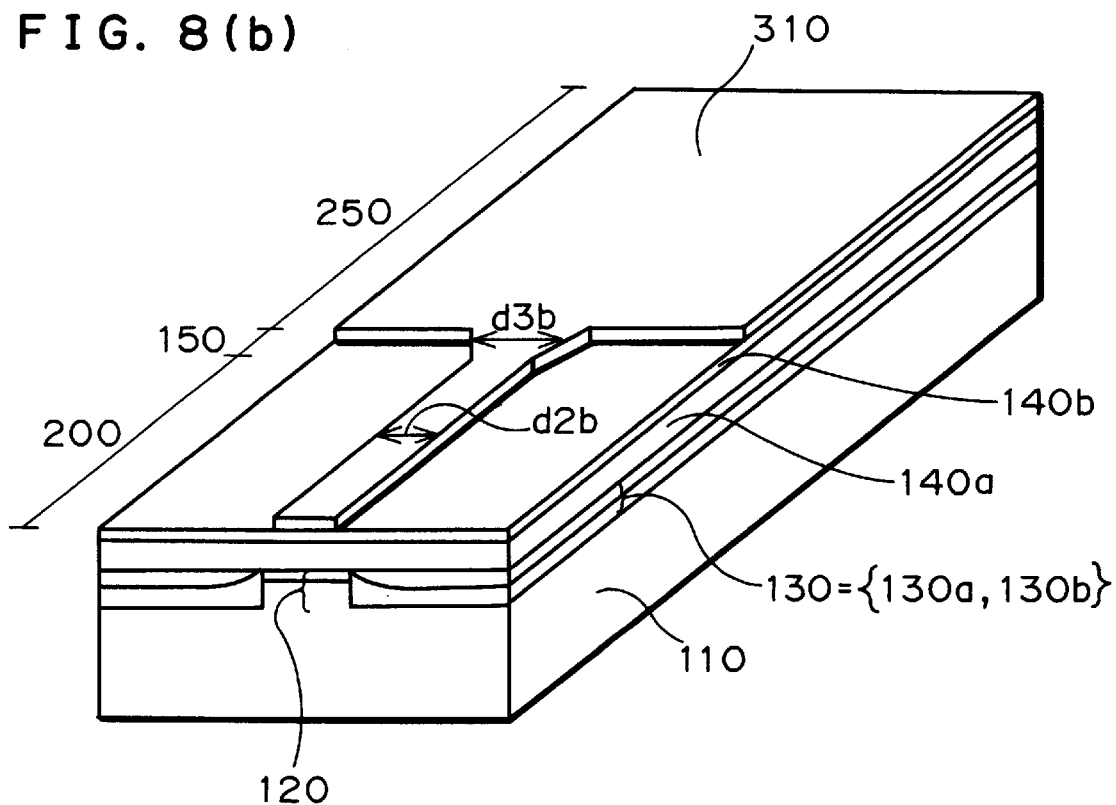

Then, as illustrated in FIGS. 8(a) and 8(b), a p-InP clad layer 140a and a contact layer 140b are sequentially grown (regrowth) on the embedded layer 130 and the mesa structure 120. In the laser area 250, a light trapping structure for the active layer 254 is achieved through this regrowth, and the wave guide channel 250a having a core constituted of the active layer 254 is formed.

In addition, through this regrowth, an n-p-n-p junction is formed, constituted of the n-InP substrate 110, the embedded layer 130 constituted of the p-InP 130a and the n-InP 130b, and the p-InP clad layer 140a at the two sides of the light wave guide channel 250a at the separation area 254. Thus, in the laser area 250, an electric current can be injected with a high degree of reliability into the active layer 254 at the light wave guide channel 250a.

Then, a second etching 310 of this embodiment is formed on the contact layer 140b through regular photolithography. This second etching mask 310 is formed over the entire upper surface of the laser area 250. In addition, the second etching mask 310 is formed to have a width d2b of approximately 2–3 micrometers (<d2a=approximately 20–30 micrometers) in the modulator area 200.

Furthermore, the second etching mask 310 is formed to have a width d3b changing in a continuous manner from d2b to the width in the laser area 250 starting from the modulator area 200 toward the laser area 250. In other words, the second etching mask 310 is formed to have a tapered shape which is the reverse of the first etching mask 300 illustrated in FIGS. 5(a) and 5(b).

Figure 9A:
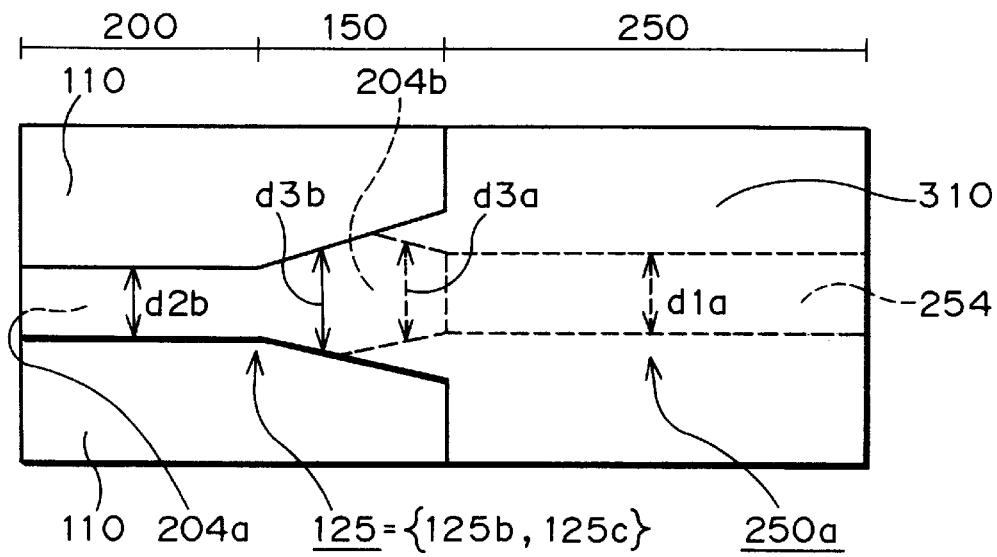
Figure 9B:
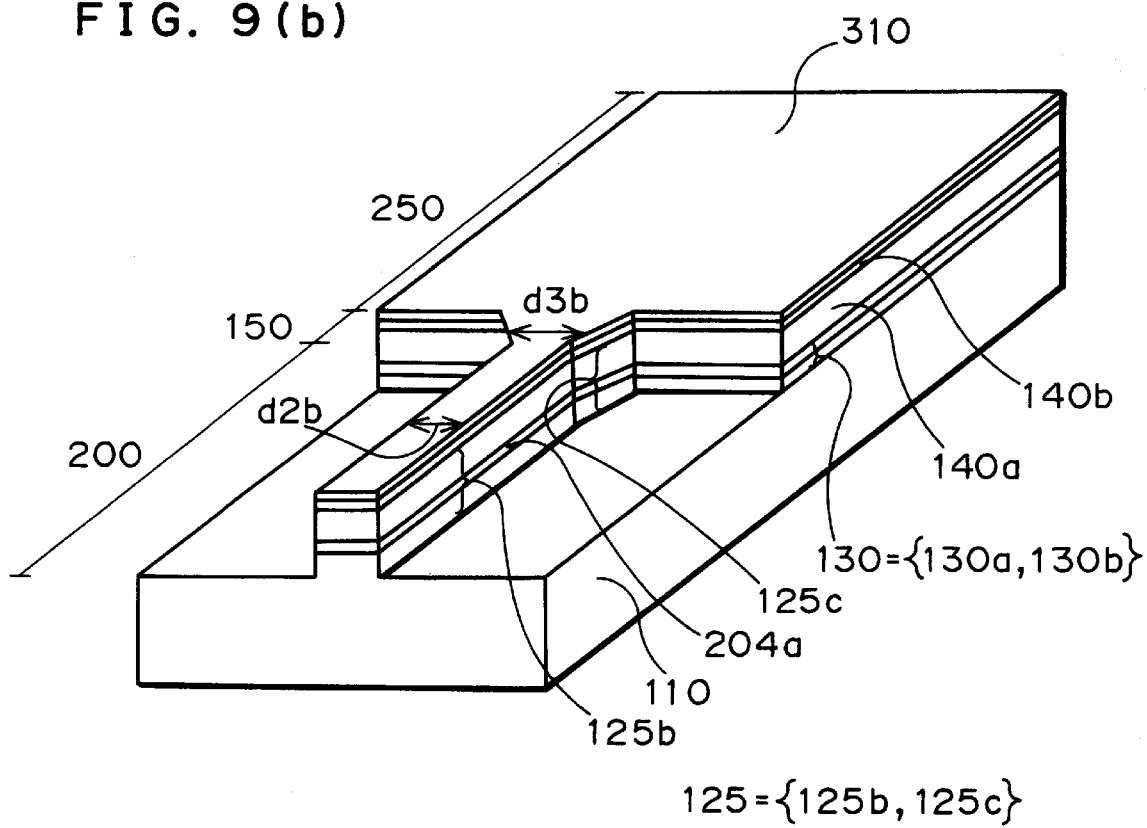

Then, as illustrated in FIGS. 9(a) and 9(b), the portions of the clad layer 140a and the contact layer 140b that are not covered by the second etching mask 300 are etched until the upper surface of the substrate 110 is exposed. Through this etching, a mesa structure 125b having a width d2b is constituted of the upper portion of the substrate 110, the absorption layer 204a, the clad layer 140a and the contact layer 140b in the modulator area 200. Moreover, a mesa structure 125c whose width d3a changes in a continuous manner is formed at the separation area 150. In this mesa structure 125c, the light wave guide layer 204b in the embodiment is formed to have its width expanding in the vicinity of the middle area between the modulator area 200 and the laser area 250.

Figure 10A:
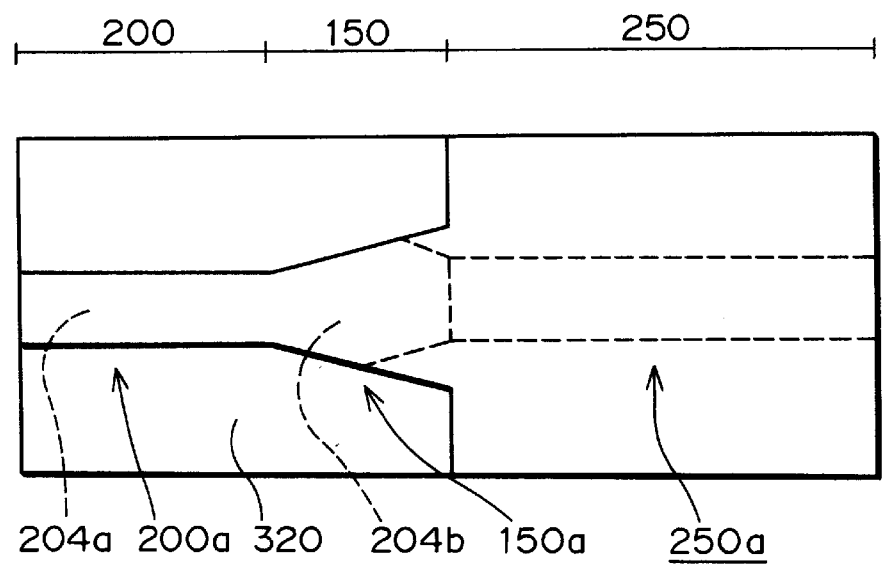
Figure 10B:
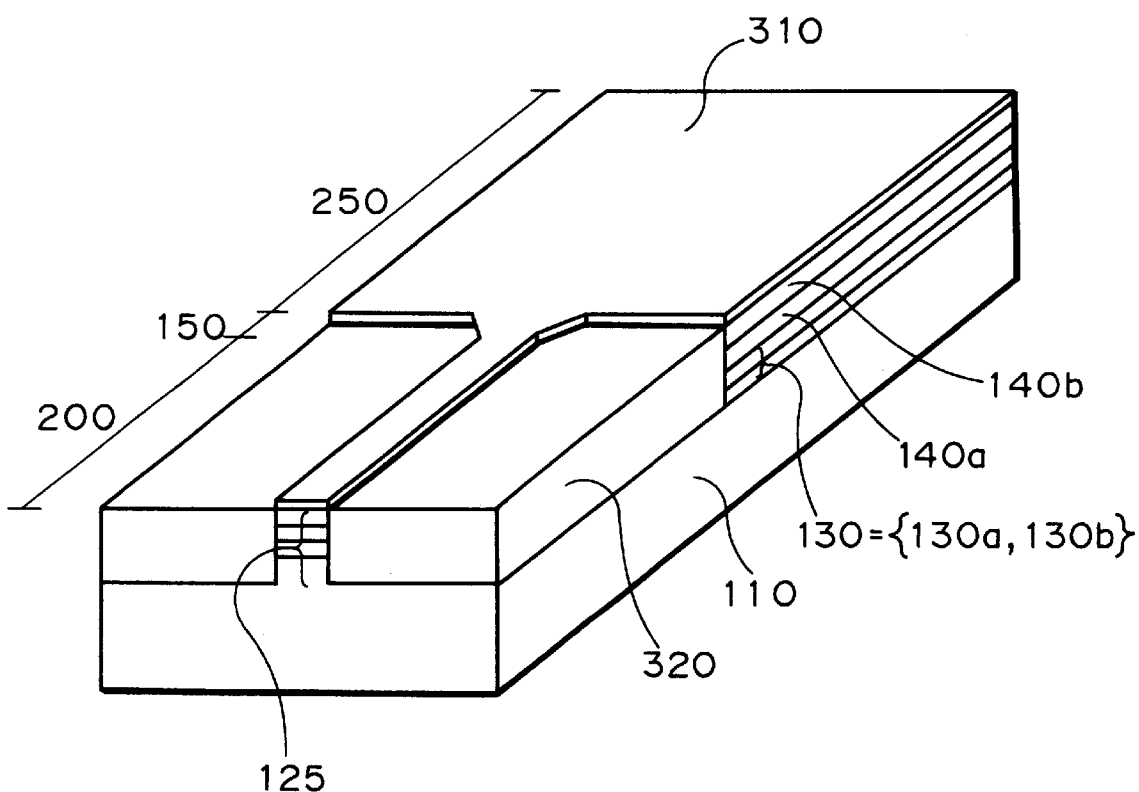

Next, as illustrated in FIGS. 10(a) and 10(b) the two sides of the mesa structure 125 (the mesa structure 125b and the mesa structure 125c) are filled with a polyimide 320. Through this filling with the polyimide 320, the wave guide channel 200a having a core constituted of the absorption layer 204a is formed in the modulator area 200. In addition, in the separation area 150, the wave guide channel 150a having a core constituted of the light wave guide layer 204b in this embodiment with its width expanding in the middle area is formed. Next, when the filling with the polyimide 320 is completed, the second etching mask 310 is removed.

Then, as illustrated in FIGS. 1(a) and 1(b), a first electrode 330a is provided to cover the entire upper surface of the absorption area 250 and a second electrode 330b is provided on the upper surface of the modulator area 200 located above the wave guide channel 200a. In addition, a common electrode 330c is provided to cover the entire lower surface of the substrate 110, thereby constituting the modulator integrated laser 100 in this embodiment.

Figure 11:
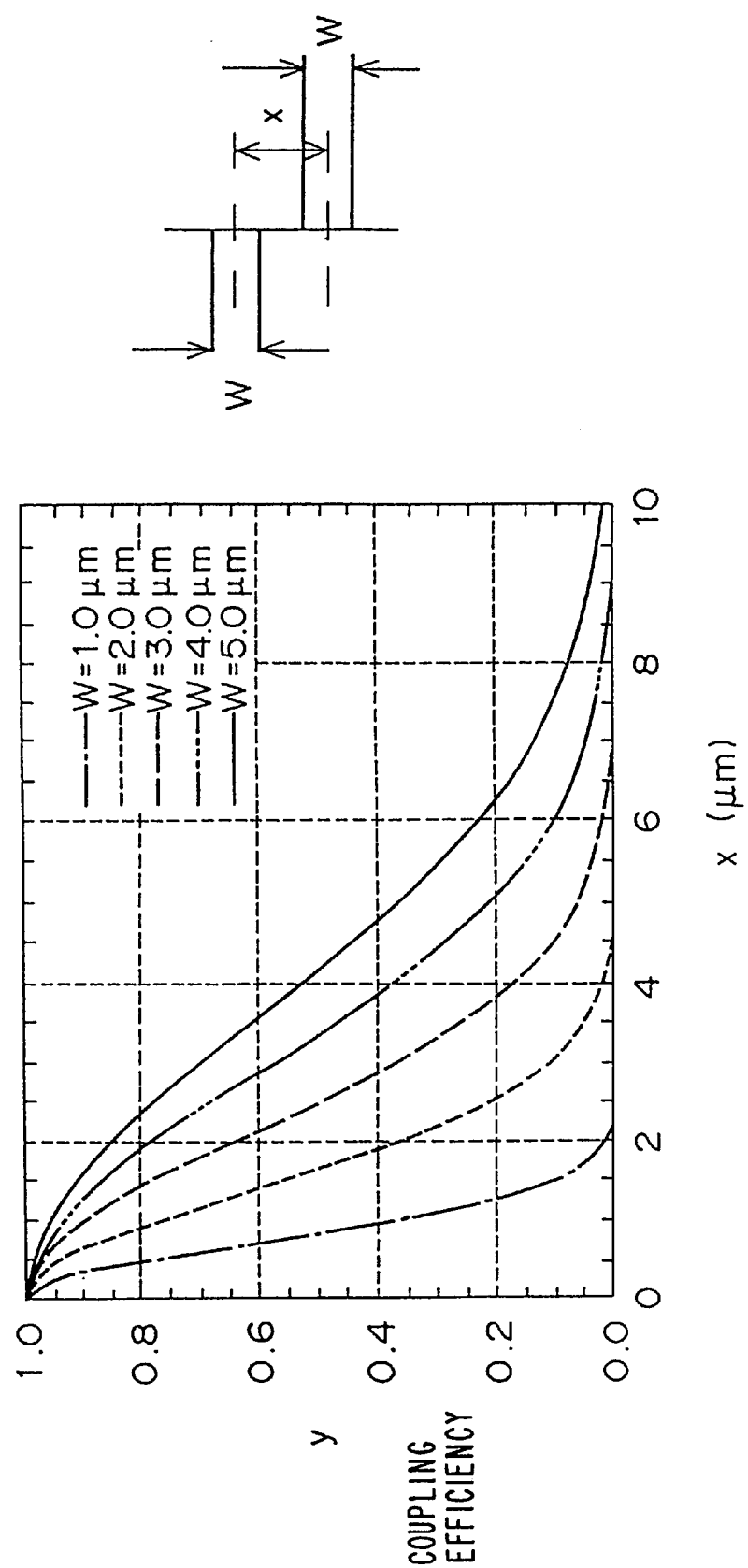
FIG. 11 presents a graph indicating the relationship between the quantity of misalignment of the wave guide channels and the coupling efficiency of the guided wave light.

The coupling efficiency between the modulator area 200 and the laser area 250 in the modulator integrated laser 100 thus formed is now explained in reference to FIG. 1(a) and FIG. 11.

In the modulator integrated laser 100, the wave guide channel 200a in the modulator area 200 and the wave guide channel 250a in the laser area 250 are connected with each other by the wave guide channel 150a at the separation area 150. In other words, the coupling efficiency between the wave guide channel 200a and the wave guide channel 250a is essentially equal to the coupling efficiency that is achieved when two wave guide channels having cores with their widths approximately equal to a maximum width of the light wave guide layer 204b in this embodiment are connected with each other.

As shown in FIG. 11, when two wave guide channels are connected, the coupling loss resulting from misalignment is reduced to a greater degree with the width w of the cores of the two wave guide channels set larger. Thus, it is understood that coupling loss in the light wave guide occurring as a result of misalignment of the wave guide channels is reduced in the coupling between the modulator area 200 and the laser area 250.

More specifically, the maximum width of the light wave guide layer 204b is approximately 5–10 micrometers in the modulator integrated laser 100 in this embodiment. Consequently, even if the alignment of the absorption layer 204a and the active layer 254 is offset by 1 micrometer, the reduction in the coupling efficiency between the wave guide channel 200a and the wave guide channel 250a can be kept at approximately 0.1 or less. Since the coupling efficiency between the modulator area and the laser area is approximately 0.5–0.6 if the wave guide channel alignment is offset by 1 micrometer in a modulator integrated laser in the prior art, it is obvious that the coupling efficiency improves greatly in this embodiment.

Next, the operation of the modulator integrated laser 100 in the embodiment is explained in reference to FIGS. 1(a) and 1(b).

During the operation of the modulator integrated laser 100, a current C is injected to the laser area 250 via the first electrode 330a. In the laser area 250, this current C is injected to the active layer 254. As a result, amplification of light becomes enabled in the active layer 254 in the laser area 250. In addition, in the laser area 250, the diffraction striping 252 as illustrated in FIGS. 2(a) and 2(b) is formed in the active layer 254. Thus, in the laser area 250, wavelength-selective reflection of light through coupling in a reverse direction is achieved.

In addition, during the operation of the modulator integrated laser 100, a voltage V is applied to the modulator area 200 via the second electrode 330b. In the modulator area 200, this voltage V is applied to the absorption layer 204a. As a result, intensity modulation is achieved through the absorption achieved in the absorption layer 204a.

Consequently, in the modulator integrated laser 100 in the embodiment, an injected incident light P1 entering from the side where the modulator area 200 is provided, undergoes intensity modulation in the absorption layer 204a in the modulator area 200 and laser oscillation in the laser area 250 achieved through amplification and the reflection at the active layer 254, it is then output at the side where the modulator area 200 is provided as an output light P2 having a specific waveform.

As has been explained, in the embodiment, since the coupling loss resulting from misalignment of the wave guide channels is reduced, an alignment of wave guide channels with a lesser degree of light loss is achieved with ease. In addition, since the width of the light wave guide layer in the separation area changes in a continuous manner, no increase in transmission loss caused by scattering and leakage of light and the like occurs. As a result, since the degree of accuracy that is required in the manufacturing process in order to realize an integrated optical element with a smaller loss of light is made less exacting in this embodiment, it becomes possible to provide an integrated optical element that achieves a high yield at a lower initial cost.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while the explanation has been given in reference to the embodiment above on an integrated optical element employing 5-layer and 7-layer multiple quantum well type wave guide channels, the present invention is not limited to this structure, and the present invention may be adopted in an integrated optical element employing multiple quantum well type wave guide channels with various other cycles.

In addition, while the explanation has been given in reference to the embodiment above on an example of an integrated optical elements employing a wave guide channel having a high mesa structure and an embedded type wave guide channel, the present invention is not limited to this structure, and the present invention may be adopted in an integrated optical element employing various other types of wave guide channels such as wave guide channels having a low mesa structure and ridge type wave guide channels.

Furthermore, while the explanation has been given in reference to the embodiment above on an integrated optical element adopting a multiple quantum well type wave guide channel, the present invention is not restricted to this structure, and the present invention may be adopted in an integrated optical element employing various other wave guide channel structures such as distortion quantum well type wave guide channels and bulk type wave guide channels.

Moreover, while the explanation has been given in reference to the embodiment above on an integrated optical element employing an active layer having a width of approximately 1.5–2 micrometers, an absorption layer having a width of approximately 2–3 micrometers and a light wave guide layer having a maximum width of approximately 5–10 micrometers, the present invention is not restricted to this structure, and the present invention may be adopted in an integrated optical element employing an active layer, an absorption layer and a light wave guide layer having various other widths.

In addition, the explanation has been given in reference to the embodiment above on an integrated optical element in which a modulator area and a laser area are formed, the present invention is not restricted to this structure, and the present invention may be adopted in an integrated optical element in which various other functional areas including a light amplifier, a light phase adjuster, a light switch and the like are formed.

Furthermore, while the explanation has been given in reference to the embodiment above on an example of an integrated optical element whose main constituents are InP and GaAs, the present invention is not restricted to this structure, and the present invention may be adopted in an integrated optical element constituted of various other optical materials including semiconductor materials such as Si, and oxide materials such as $LiNbO_3$ and the like as its main constituents.

As has been explained, in the integrated optical element according to the present invention, the coupling loss resulting from misalignment of wave guide channels is greatly reduced compared to that in an integrated optical element in the prior art constituted by directly connecting the wave guide channels to each other. As a result, according to the present invention, an integrated optical element that achieves an improvement in yield is provided through a less rigorous requirement for alignment accuracy between wave guide channels during the manufacturing process.

Ideally, in the integrated optical element according to the present invention, the width of the core (corresponds to the light wave guide layer 204b in the embodiment explained earlier) of the wave guide channel (corresponds to the wave guide channel 150a in the separation area 150 in the embodiment explained earlier) that optically connects the light wave guide layer wave guide channels to each other should change in a continuous manner. Through this structure, the transmission loss of the wave guided light can be reduced and, as a result, the total loss of the wave guided light in the integrated optical element can be further reduced. It is to be noted that the wave guide channels in the integrated optical element according to the present invention may be constituted as various different types of wave guide channels including quantum well type wave guide channels such as multiple quantum well type wave guide channels and distortion quantum well type wave guide channels and bulk type wave guide channels.

In addition, the integrated optical element according to the present invention may be constituted as a so-called modulator integrated laser. When the present invention is adopted in a modulator integrated laser, a reduction of the coupling loss is achieved between its laser area and modulator area, which constitute its functional areas. Thus, a laser light oscillated in the laser area can undergo specific modulation in the modulator area in a state of low loss. In other words, in a modulator integrated laser adopting the present invention, high intensity light having various waveforms such as light pulse and digitalized optical signals, can be formed.

In addition, in the method for manufacturing an integrated optical element according to the present invention, the junction portion of the mesa structures of the two wave guide channels achieves a structure that extends in the direction vertical to the direction in which the mesa structures are laminated. In other words, through the method for manufacturing an integrated optical element according to the present invention, the integrated optical element according to the present invention is achieved.

As has been explained, since the required accuracy for wave guide channel alignment is less rigorous in the integrated optical element according to the present invention, its manufacture is facilitated. As a result, by employing the method for manufacturing an integrated optical element according to the present invention, high yield in the production of integrated optical elements is achieved.

Furthermore, in the method for manufacturing an integrated optical element according to the present invention, a so-called tapered boundary portion is formed through etching employing the first etching mask during the first etching step. Then, during the second etching step, a tapered boundary portion is formed that is oriented in the reverse direction from the taper formed during the first etching step.

Consequently, the alignment of the first and second etching masks can be achieved very easily. In other words, in the method for manufacturing an integrated optical element according to the present invention, misalignment of the first wave guide channel and the second wave guide channel formed at the integrated optical element, too, is less likely to occur.

What is claimed is:

1. An integrated optical element comprising:
   (a) a first functional area including a fist active element that performs optical processing, said first functional area having a first wave guide channel;
   (b) a second functional area including a second active element that performs optical processing, said second functional area having a second wave guide channel; and
   (c) a third wave guide channel having a boundary area and provided with a core having a larger width than a core at a rear end portion of said second wave guide channel and a core at a rear end portion of said first wave guide channel, which optically connects said rear end portion of said first wave guide channel and said rear end portion of said second wave guide channel;
   wherein said width of said core at said third wave guide channel expands as said core approaches said boundary area.

2. An integrated optical element according to claim 1, wherein:
   said width of said core of said third wave guide changes in a continuous manner.

3. An integrated optical element according to claim 2, wherein:
   said first functional area is a laser oscillator and said second functional area is a light intensity modulator.

4. An integrated optical element according to claim 2, wherein:
   at least one of said first wave guide channel, said second wave guide chanel and said third wave guide channel is constituted of a quantum well type wave guide channel.

5. An integrated optical element according to claim 4, wherein:
   said first functional area is a laser oscillator and said second functional area is a light intensity modulator.

6. An integrated optical element according to claim 1, wherein:
   at least one of said first wave guide channel, said second wave guide chanel and said third wave guide channel is constituted of a multiple quantum well type wave guide channel.

7. An integrated optical element according to claim 6, wherein:
   said first functional area is a laser oscillator and said second functional area is a light intensity modulator.

8. An integrated optical element according to claim 6, wherein:
   at least one of said first wave guide channel, said second wave guide chanel and said third wave guide channel is constituted of a distortion quantum well type wave guide channel.

9. An integrated optical element according to claim 8, wherein:

said first functional area is a laser oscillator and said second functional area is a light intensity modulator.

10. An integrated optical element according to claim 1, wherein:

at least one of said first wave guide channel, said second wave guide channel and said third wave guide channel is constituted of a bulk type wave guide channel.

11. An integrated optical element according to claim 10, wherein:

said first functional area is a laser oscillator and said second functional area is a light intensity modulator.

12. An integrated optical element according to claim 1, wherein:

said first functional area is a laser oscillator and said second functional area is a light intensity modulator.

13. A method for forming an integrated optical element, said method comprising forming a first functional area including a first active element which performs a first optical processing and includes a first wave guide channel having a first mesa structure, and forming a second functional area including a second active element which performs a second optical processing and includes a second wave guide channel having a second mesa structure, further comprising:

a step in which said first mesa structure at said first wave guide channel is formed in such a manner that a width in a boundary area between said first functional area and said second functional area increases in a continuous manner from said first functional area toward said second functional area; and a step in which a second mesa structure at said second wave guide channel is formed in such a manner that said width of said boundary area increases in a continuous manner starting from said second functional area toward said first functional area.

14. A method for forming an integrated optical element provided with a first functional area having a first wave guide channel formed with a first mesa structure and a second functional area having a second wave guide channel formed with a second mesa structure, comprising:

a step in which a first core layer of said first wave guide channel is formed over an entire substrate;

a step in which etching is performed down to said substrate in such a manner that said first core layer is left unetched in an island shape only at said first functional area;

a step in which a second core layer of said second wave guide channel is formed around said first core layer left in an island shape;

a step in which said first mesa structure at said first wave guide channel is formed in such a manner that a width in a boundary area between said first functional area and said second functional area increases in a continuous manner from said first functional area toward said second functional area;

a step in which sides of said first mesa structure are filled with a semiconductor layer;

a step in which a clad layer is laminated over said first core layer and said second core layer;

a step in which a second mesa structure at said second wave guide channel is formed in such a manner that said width of said boundary area increases in a continuous manner starting from said second functional area toward said first functional area; and a step in which sides of said second mesa structure are filled.

15. A method for forming an integrated optical element according to claim 14, wherein:

said first core layer and said second core layer are formed through epitaxial growth.

16. A method for forming an integrated optical element according to claim 15, wherein:

said semiconductor layer is formed by laminating two complementary semiconductor layers.

17. A method for forming an integrated optical element according to claim 15, wherein:

said sides of said second mesa structure are filled with polyimide.

* * * * *